(12) United States Patent
Ha et al.

(10) Patent No.: US 11,887,870 B2
(45) Date of Patent: *Jan. 30, 2024

(54) APPARATUS AND METHOD FOR SUPPLYING LIQUID

(71) Applicant: SEMES CO., LTD., Cheonan-si (KR)

(72) Inventors: Do Gyeong Ha, Daegu (KR); Seung Tae Yang, Yongin-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/563,002

(22) Filed: Dec. 27, 2021

(65) Prior Publication Data

US 2022/0208568 A1  Jun. 30, 2022

(30) Foreign Application Priority Data

Dec. 28, 2020 (KR) .......................... 10-2020-0184417

(51) Int. Cl.
*H01L 21/67* (2006.01)
*B08B 3/02* (2006.01)
(Continued)

(52) U.S. Cl.
CPC ........ *H01L 21/67051* (2013.01); *B08B 3/022* (2013.01); *B08B 3/10* (2013.01);
(Continued)

(58) Field of Classification Search
CPC ......... H01L 21/67103; H01L 21/67051; H01L 21/67017; H01L 21/67248; B08B 3/10;
(Continued)

(56) References Cited

U.S. PATENT DOCUMENTS

2014/0290698 A1 10/2014 Yun et al.
2015/0176928 A1* 6/2015 Tabuchi ............. G05D 23/1951
165/96

(Continued)

FOREIGN PATENT DOCUMENTS

CN      106158707      11/2016
CN      108109941       6/2018
(Continued)

OTHER PUBLICATIONS

Office Action from the Taiwan Intellectual Property Office dated Aug. 10, 2022.
Office Action by the Japan Patent Office dated Jan. 10, 2023.

*Primary Examiner* — Benjamin L Osterhout

(57) ABSTRACT

A liquid supply unit includes a tank having an inner space for storing the liquid, an inlet line for supplying the liquid from the liquid supply source to the inner space and having an inlet valve installed thereon, an outlet line for supplying the liquid from the tank to a nozzle or for recollecting the liquid to the tank and having an outlet valve installed thereon, a gas supply line for supplying a gas to the inner space and having a gas control valve installed thereon, an exhaust line for exhausting the inner space and having an exhaust valve installed thereon, a circulation line for circulating the liquid stored in the inner space, and a controller controlling the liquid supply unit so that the circulation line is pressurized while the liquid is supplied to the inner space.

11 Claims, 11 Drawing Sheets

(51) Int. Cl.
*B08B 3/10* (2006.01)
*B08B 13/00* (2006.01)

(52) U.S. Cl.
CPC ........ *B08B 13/00* (2013.01); *B08B 2203/007* (2013.01); *B08B 2203/027* (2013.01); *H01L 21/67017* (2013.01); *H01L 21/67103* (2013.01); *H01L 21/67248* (2013.01)

(58) Field of Classification Search
CPC ... B08B 13/00; B08B 3/022; B08B 2203/007; B08B 2203/027
See application file for complete search history.

(56) References Cited

U.S. PATENT DOCUMENTS

| | | |
|---|---|---|
| 2017/0312794 A1 | 11/2017 | Park et al. |
| 2018/0093205 A1 | 4/2018 | Yoshihara et al. |
| 2021/0197237 A1* | 7/2021 | Yun .................. H01L 21/67017 |

FOREIGN PATENT DOCUMENTS

| | | |
|---|---|---|
| CN | 109427627 | 3/2019 |
| JP | 2017028112 | 2/2017 |
| KR | 101491055 | 10/2014 |
| KR | 1020190003107 | 1/2019 |
| KR | 1020190089801 | 7/2019 |
| KR | 10-2015-0131071 | 1/2021 |
| TW | 201921553 | 6/2019 |
| WO | 2016121704 | 8/2016 |

* cited by examiner

APPARATUS AND METHOD FOR SUPPLYING LIQUID

CROSS-REFERENCE TO RELATED APPLICATIONS

A claim for priority under 35 U.S.C. § 119 is made to Korean Patent Application No. 10-2020-0184417 filed on Dec. 28, 2020, in the Korean Intellectual Property Office, the entire contents of which are hereby incorporated by reference.

BACKGROUND

Embodiments of the inventive concept described herein relate to a liquid supply unit for supplying a liquid to an object to be treated and a method for supplying the liquid using the same.

Contaminants such as particles, organic pollutants, and metal contaminants remaining on a surface of a substrate have a great influence on properties and a production yield of semiconductor devices. For this reason, a cleaning process of removing various contaminants attached to the surface of the substrate is very important in a semiconductor manufacturing process, and a process of cleaning the substrate is performed before and after each unit process of manufacturing semiconductors.

In general, the substrate cleaning process includes a chemical treating process of removing metal contaminants, organic materials, or particles remaining on the substrate using a chemical, a rinsing process of removing the chemical remaining on the substrate using pure water, and a drying process of drying the substrate using a nitrogen gas or a supercritical fluid.

In the chemical treating process, a liquid supply unit provides the liquid to a nozzle unit. In general, the liquid supply unit includes a tank for storing the liquid, a supply line for providing the liquid from an inner space of the tank to the nozzle unit, a recollecting line for recollecting the liquid into the inner space of the tank after treating the substrate, etc. To prevent the liquid supply from being stopped, two or more tanks are provided, and the liquid stored in each tank is discharged by the drain line connected to each tank.

For example, the liquid supply unit supplies the liquid at a predetermined temperature to the nozzle unit. Each line is provided with a heater to provide the liquid at a high temperature according to each process. In general, a temperature sensor is provided at a discharge end of the heater. The liquid is heated to the predetermined temperature based on a temperature of the liquid measured by the temperature sensor. However, since the heater heats the liquid without considering a temperature at a contact surface with the liquid, the liquid at the contact surface is heated to form a bubble. Such bubble has a problem of forming particles on the substrate in a subsequent process of treating the substrate.

SUMMARY

Embodiments of the inventive concept provide a liquid supply unit and a liquid supply method for preventing a liquid from boiling within the liquid supply unit.

Embodiments of the inventive concept also provide a liquid supply unit and a liquid supply method for minimizing particle generation.

The technical objectives of the inventive concept are not limited to the above-mentioned ones, and the other unmentioned technical objects will become apparent to those skilled in the art from the following description.

The inventive concept provides a liquid supply unit. The liquid supply unit comprises: a tank having an inner space for storing the liquid; an inlet line for supplying the liquid from a liquid supply source to the inner space and having an inlet valve installed thereon; an outlet line for supplying the liquid from the tank to a nozzle or for recollecting the liquid to the tank and having an outlet valve installed thereon; a gas supply line for supplying a gas to the inner space and having a gas control valve installed thereon; an exhaust line for exhausting the inner space and having an exhaust valve installed thereon; a circulation line for circulating the liquid stored in the inner space; and a controller, wherein the controller is configured to control the liquid supply unit so that the circulation line is pressurized while the liquid is supplied to the inner space.

In an embodiment, the controller is further configured to control the gas control valve and the exhaust valve so that the inner space is pressurized while the liquid is supplied to the inner space.

In an embodiment, the controller is configured to control the gas control valve and the exhaust valve so that the gas is supplied to the inner space but the exhaust valve is closed, while the liquid is supplied to the inner space.

In an embodiment, the circulation line comprises: a first pump; a first heater for heating the liquid within the circulation line; and a pressure providing member provided at a downstream of the first heater, wherein a pressure of the liquid required to pass through the pressure providing member is provided higher than a pressure of the liquid required to pass through the first heater.

In an embodiment, the pressure providing member is provided as a first regulator, the circulation line further comprises a first pressure sensor installed at an upper stream of the first regulator and sensing a pressure of the liquid within the circulation line installed thereon, and the first regulator opens to allow a flow of the liquid when the pressure of the liquid within the circulation line becomes equal to or higher than a predetermined pressure.

In an embodiment, the first heater is provided with a first temperature sensor for measuring a temperature of a contact surface with the liquid, and the first heater is controlled so that the temperature at the contact surface with the liquid measured by the first temperature sensor does not exceed a boiling point of the liquid according to the predetermined pressure.

In an embodiment, the controller controls the exhaust valve to exhaust the inner space when the pressure of the liquid within the circulation line is equal to or higher than the predetermined pressure.

In an embodiment, the outlet line comprises: a second pump; a second heater for heating a liquid within the outlet line; a second regulator configured to be opened to allow a flow of the liquid when a pressure at an upstream of the outlet line is equal to or higher than a predetermined pressure; and a second pressure sensor installed at an upstream of the second regulator for measuring the pressure of the liquid within the outlet line.

In an embodiment, the liquid supply unit further comprises a supply line branching from the outlet line between the second heater and the second regulator and branching from the outlet line and connecting to the nozzle.

In an embodiment, a second temperature sensor for measuring the contact surface temperature of the second heater and the liquid is installed at the second heater, and the controller controls the second heater so that the contact surface temperature of the second heater and the liquid measured by the second temperature sensor does not exceed a boiling point of the liquid according to a predetermined pressure.

In an embodiment, the tank comprises a first tank and a second tank, the circulation line is connected to the first tank and the second tank, the controller is configured to control so that the liquid is supplied to the first tank through the inlet line, and the liquid of an inner space of the first tank is circulated through the circulation line, while the liquid is supplied to the nozzle through the inlet line from the second tank.

The inventive concept provides a liquid supply method. The liquid supply method comprises: supplying a liquid to an inner space of one of a first tank or a second tank simultaneously with pressurizing a circulation line circulating a liquid in the other inner space in the other of the first tank or the second tank.

In an embodiment, a gas is supplied to the inner space and the inner space is not exhausted while the liquid is supplied to the inner space.

In an embodiment, the circulation line comprises: a heater for heating the liquid within the circulation line; and a pressure providing member provided at a downstream of the heater, and wherein a pressure of the liquid required to pass through the pressure providing member is provided higher than a pressure of the liquid required to pass through the heater.

In an embodiment, the inner space is exhausted when a pressure within the circulation line reaches or becomes higher than a predetermined pressure.

In an embodiment, a temperature of the heater and a contact surface temperature of the liquid is provided to not exceed a boiling point of the liquid according to a predetermined pressure.

The inventive concept provides a liquid supply method using the substrate treating apparatus. The liquid supply method comprises: supplying the liquid through the nozzle from the inner space of the second tank while supplying the liquid to the inner space of the first tank; and circulating a liquid within the first tank through the circulation line and pressurizing the circulation line while the liquid supplying is performed.

In an embodiment, the gas is supplied to the inner space of the first tank and an inner space of the first tank is not exhausted, while the liquid is supplied to the inner space of the first tank.

In an embodiment, a liquid flow is allowed within the circulation line when the pressure of the liquid within the circulation line reaches the predetermined pressure.

In an embodiment, a heater is provided at the circulation line, and a contact surface temperature of the heater and the liquid is provided to not exceed a boiling point of the liquid according to the predetermined pressure.

According to an embodiment of the inventive concept, it is possible to prevent the liquid from boiling in the liquid supply unit.

According to an embodiment of the inventive concept, generation of particles may be minimized.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
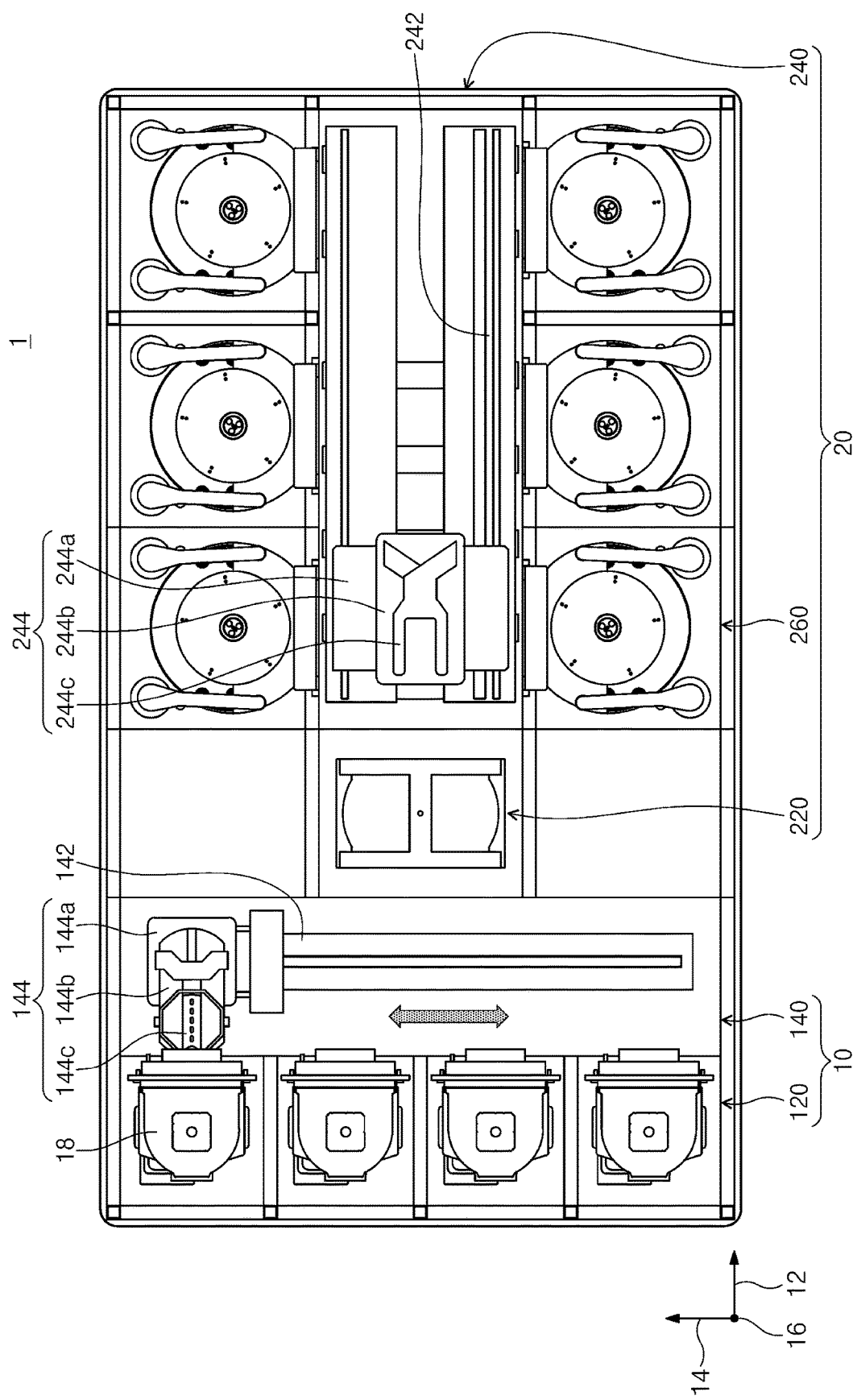
FIG. 1 is a front view schematically illustrating an embodiment of a substrate treating facility provided with a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

FIG. 1 is a plan view schematically illustrating a substrate treating facility 1 of the inventive concept. Referring to FIG. 1, the substrate treating facility 1 has an index module 10 and a processing module 20, and the index module 10 has a load port 120 and a transfer frame 140. The load port 120, the transfer frame 140, and the processing module 20 are sequentially aligned. Hereinafter, a direction in which the load port 120, the transfer frame 140, and the processing module 20 are aligned is referred to as a first direction 12. When viewed from above, a direction perpendicular to the first direction 12 is referred to as a second direction 14, and a direction perpendicular to a plane including the first direction 12 and the second direction 14 is referred to as a third direction 16.

A carrier 130 in which the substrate W is accommodated is seated on the load port 120. A plurality of load ports 120 are provided, and they are arranged sequentially along the second direction 14. FIG. 1 illustrates that four load ports 120 are provided. However, the number of load ports 120 may increase or decrease according to conditions such as process efficiency and foot printing of the processing module 20. A slot (not shown) provided to support an edge of the substrate is formed at the carrier 130. A plurality of slots are provided in the third direction 16, and the substrate is located in the carrier to be stacked while being spaced apart from each other along the third direction 16. As the carrier 130, a front opening unified pod (FOUP) may be used.

The processing module 20 includes a buffer unit 220, a transfer chamber 240, and a process chamber 260. The transfer chamber 240 is provided such that its lengthwise direction is parallel to the first direction 12. The process chambers 260 are disposed at one side and at another side of the transfer chamber 240 along the second direction 14, respectively. The process chambers 260 located on one side of the transfer chamber 240 and the process chambers 260 located on another side of the transfer chamber 240 are provided to be symmetrical to each other with respect to the transfer chamber 240. Some of the process chambers 260 are disposed along a lengthwise direction of the transfer chamber 240. In addition, some of the process chambers 260 are disposed to be stacked on each other.

That is, the process chambers 260 may be arranged on one side of the transfer chamber 240 in an arrangement of A×B (A and B are natural numbers of 1 or more, respectively). Here, A is a number of the process chambers 260 provided sequentially along the first direction 12, and B is a number of the process chambers 260 provided sequentially along the third direction 16. When four or six process chambers 260 are provided on one side of the transfer chamber 240, the process chambers 260 may be arranged in an arrangement of 2×2 or 3×2. The number of process chambers 260 may increase or decrease. Unlike the above description, the process chamber 260 may be provided only on one side of the transfer chamber 240. In addition, unlike the above description, the process chamber 260 may be provided in a single layer on one side or both sides of the transfer chamber 240.

The buffer unit 220 is disposed between the transfer frame 140 and the transfer chamber 240. The buffer unit 220 provides a space in which the substrate W stays before the substrate W is transferred between the transfer chamber 240 and the transfer frame 140. The buffer unit 220 is provided with slots (not shown) on which the substrate W is placed, and a plurality of slots (not shown) are provided to be spaced apart from each other along the third direction 16. In the buffer unit 220, a surface facing the transfer frame 140 and a surface facing the transfer chamber 240 are respectively opened.

The transfer frame 140 transfers the substrate W between the carrier 130 seated on the load port 120 and the buffer unit 220. The transfer frame 140 is provided with an index rail 142 and an index robot 144. The index rail 142 is provided such that its lengthwise direction is parallel to the second direction 14. The index robot 144 is installed on the index rail 142 and is linearly moved in the second direction 14 along the index rail 142.

The index robot 144 has a base 144a, a body 144b, and an index arm 144c. The base 144a is installed to be movable along the index rail 142. The body 144b is coupled to the base 144a. The body 144b is provided to be movable along the third direction 16 on the base 144a. In addition, the body 144b is provided to be rotatable on the base 144a. The index arm 144c is coupled to the body 144b and is provided to be forwardly and backwardly movable with respect to the body 144b. A plurality of index arms 144c are provided to be individually driven. The index arms 144c are disposed to be stacked while being spaced apart from each other in the third direction 16. Some of the index arms 144c may be used to transport the substrate W from the processing module 20 to the carrier 130, and the others may be used to transport the substrate W from the carrier 130 to the processing module 20. This may prevent particles generated from the substrate W before processing from being attached to the substrate W after processing in a process of bringing in and taking out the substrate W by the index robot 144.

The transfer chamber 240 transfers the substrate W between the buffer unit 220 and the process chamber 260 and between the process chambers 260. The transfer chamber 240 is provided with a guide rail 242 and a main robot 244. The guide rail 242 is provided such that its lengthwise direction is parallel to the first direction 12. The main robot 244 is installed on the guide rail 242 and is linearly moved along the first direction 12 on the guide rail 242. The main robot 244 has a base 244a, a body 244b, and a main arm 244c. The base 244a is installed to be movable along the guide rail 242. The body 244b is coupled to the base 244a. The body 244b is provided to be movable along the third direction 16 on the base 244a. In addition, the body 244b is provided to be rotatable on the base 244a. The main arm 244c is coupled to the body 244b, which is provided to be forwardly and backwardly movable with respect to the body 244b. A plurality of main arms 244c are provided to be individually driven. The main arms 244c are disposed to be stacked while being spaced apart from each other in the third direction 16. The main arm 244c used when the substrate is transferred from the buffer unit 220 to the process chamber 260 may be different from the main arm 244c used when the substrate is transferred from the process chamber 260 to the buffer unit 220.

A substrate treating apparatus 300 for performing a cleaning process on the substrate W is provided in the process chamber 260. The substrate treating apparatus 300 provided in each process chamber 260 may have a different structure depending on the type of cleaning process to be performed. Selectively, the substrate treating apparatus 300 in each process chamber 260 may have the same structure. Selectively, the process chambers 260 are divided into a plurality of groups, and substrate treating apparatuses 300 provided in process chambers 260 belonging to the same group may have the same structure, and substrate treating apparatuses 300 provided in process chambers 260 belonging to different groups may have different structures.

For example, when the process chamber 260 is divided into two groups, process chambers 260 of the first group may be provided at one side of the transfer chamber 240 and process chambers 260 of the second group may be provided at another side of the transfer chamber 240. Selectively, process chambers 260 of the first group may be provided on the lower layer on one side and on another other side of the transfer chamber 240, respectively, and process chambers 260 of the second group may be provided on the upper layer, i.e., over the process chambers of the first group. The process chambers 260 of the first group and the process chambers 260 of the second group may be classified according to a type of chemical used or a type of cleaning method used, respectively.

Figure 2:
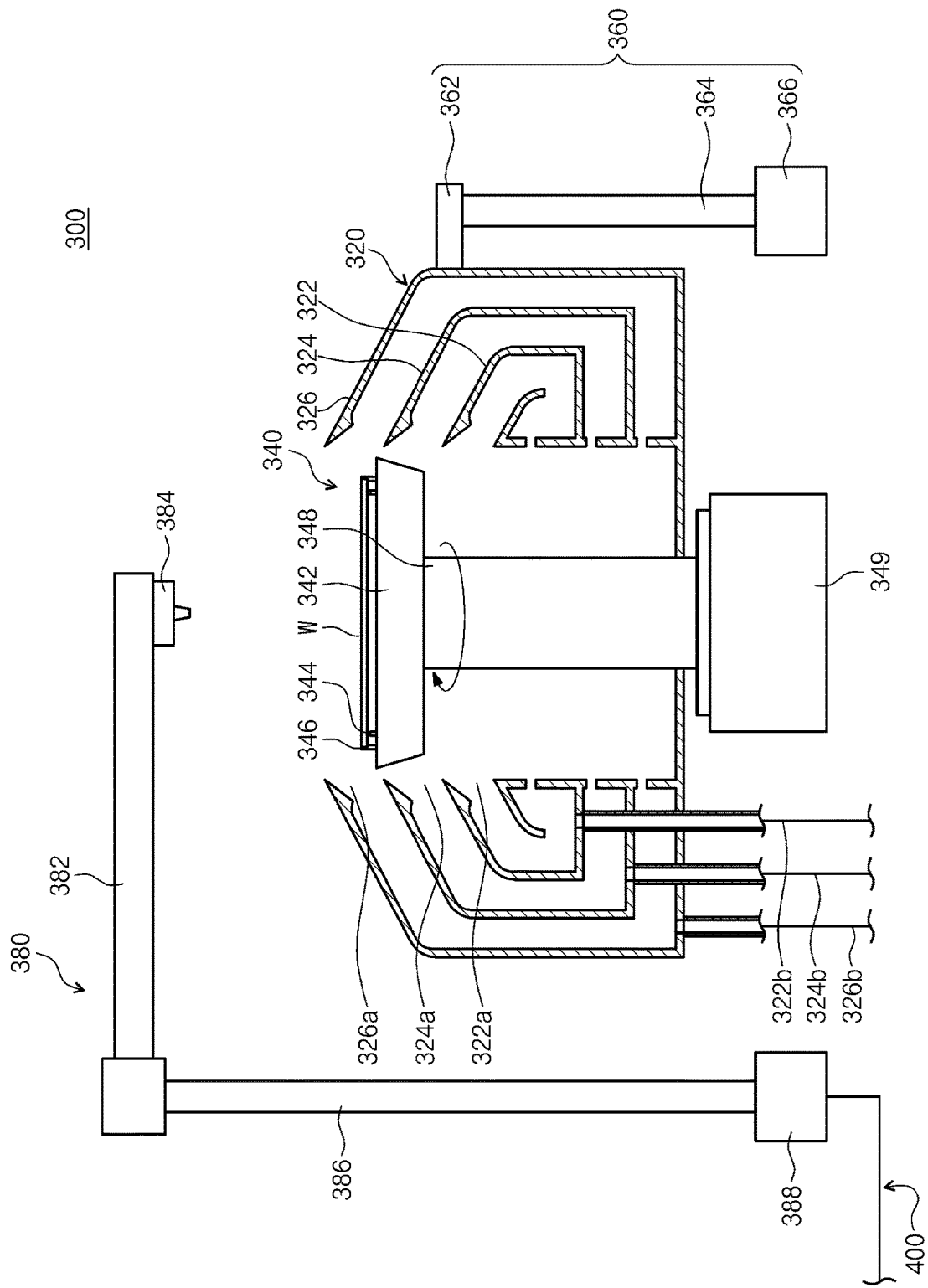
FIG. 2 is a cross-sectional view illustrating an embodiment of the substrate treating apparatus provided in a process chamber of FIG. 1.

Hereinafter, an example of the substrate treating apparatus 300 for cleaning the substrate W using a treating liquid will be described. FIG. 2 is a cross-sectional view illustrating an example of the substrate treating apparatus 300. Referring to FIG. 2, the substrate treating apparatus 300 includes a housing 320, a support unit 340, a lifting/lowering unit 360, a nozzle unit 380, and a liquid supply unit 400.

The housing 320 provides a space in which the substrate treatment process is performed, and a top portion thereof is opened. The housing 320 has an inner recollecting container 322, a middle recollecting container 324, and an outer recollecting container 326. Each of the recollecting containers 322, 324, and 326 recollect different treating liquids among the treating liquids used in the process. The inner recollecting container 322 is provided in an annular ring shape surrounding the support unit 340, the middle recollecting container 324 is provided in an annular ring shape surrounding the inner recollecting container 322, and the outer recollecting container 326 is provided in an annular ring shape surrounding the middle recollecting container 324. An inner space 322a of the inner recollecting container 322, a space 324a between the inner recollecting container 322 and the middle recollecting container 324, and a space 326a between the middle recollecting container 324 and the outer recollecting container 326 function as an inlet through which the treating liquid flows into the inner recollecting container 322, the middle recollecting container 324, and the outer recollecting container 326. Recollecting lines 322b, 324b, and 326b are connected to respective recollecting containers 322, 324, and 326 and extending downwardly from respective bottom thereof. Each of the recollecting lines 322b, 324b, and 326b discharge the treating liquid introduced through each of the recollecting containers 322, 324, and 326. The discharged treating liquid may be reused through an external treating liquid regeneration system (not shown).

The support unit 340 is disposed in the housing 320. The support unit 340 supports the substrate and rotates the substrate during the process. The support unit 340 has a body 342 (i.e., a spin head), a support pin 334, a chuck pin 346, and a support shaft 348. The body 342 has a top surface that is generally provided in a circular shape when viewed from above. A support shaft 348 rotatable by a motor 349 is fixedly coupled to a bottom surface of the body 342. A plurality of support pins 334 are provided. The support pins 334 are disposed on an edge of the top surface of the body 342 to be spaced apart from each other by a predetermined distance and upwardly protrude from the body 342. The support pins 334 are disposed to have an annular ring shape as a whole by combination with each other. The support pins 334 support a bottom surface edge of the substrate so that the substrate is spaced apart from the top surface of the body 342 by a predetermined distance. A plurality of chuck pins 346 are provided. The chuck pins 346 are disposed farther from a center of the body 342 than the support pins 334. The chuck pins 346 are provided to upwardly protrude from the body 342. The chuck pins 346 support a side of the substrate so that the substrate is not laterally deviated from a certain position when the spin head 342 is rotated. The chuck pins 346 are provided to be linearly movable between a standby position and a support position along a radial direction of the body 342. The standby position is a position far away from the center of the body 342 than the support position is. When the substrate W is loaded on the spin head 342 or is unloaded from the spin head 342, the chuck pins 346 are located at the standby position, and when a process is performed on the substrate, the chuck pins 346 are located at the support position. At the support position, the chuck pins 346 are in contact with the side of the substrate W.

The lifting/lowering unit 360 linearly moves the housing 320 in an up/down direction. As the housing 320 is moved up and down, a relative height of the housing 320 with respect to the support unit 340 is changed. The lifting/lowering unit 360 has a bracket 362, a moving shaft 364, and a driver 366. The bracket 362 is fixedly installed on an outer wall of the housing 320, and the moving shaft 364 moved in the up/down direction by the driver 366 is fixedly coupled to the bracket 362. The housing 320 is lowered so that the support unit 340 upwardly protrudes from the housing 320 when the substrate W is placed on the support unit 340 or is lifted from the support unit 340. In addition, when the process proceeds, the level of the housing 320 is adjusted so that the treating liquid may flow into a predetermined recollecting container according to the type of treating liquid supplied to the substrate W. For example, while the substrate is being treated with the first treating liquid, the substrate is located at a level corresponding to the inner space 322a of the inner recollecting container 322. In addition, during the treatment of the substrate with the second treating liquid and the third treating liquid, the substrate may be located at a level corresponding to the space 326a between the inner recollecting container 322 and the middle recollecting container 324, respectively. Unlike the above description, the lifting/lowering unit 360 may move the spin head 342 in the up/down direction instead of the housing 320.

The nozzle unit 380 supplies a treating liquid to the substrate W during the substrate treatment process. The nozzle unit 380 has a nozzle support 382, a nozzle 384, a support shaft 386, and a driver 388. The support shaft 386 is provided such with its lengthwise direction in the third direction 16, and a driver 388 is coupled to a bottom end of the support shaft 386. The driver 388 rotates and lifts the support shaft 386. The nozzle support 382 is vertically coupled to an opposite end of the support shaft 386 coupled to the driver 388. The nozzle 384 is installed on a bottom surface of an end of the nozzle support 382. The nozzle 384 is moved to a process position and a standby position by the driver 388. The process position is a position where the nozzle 384 is disposed vertically above the housing 320, and the standby position is a position where the nozzle 384 deviates from being vertically above the housing 320.

One or more nozzle units 380 may be provided. When a plurality of nozzle units 380 are provided, a chemical, a rinsing liquid, or an organic solvent may be provided through different nozzle units 380. In an embodiment, the chemical may be an acidic solution such as a hydrofluoric acid, a sulfuric acid, a nitric acid, a phosphoric acid, or the like, or an alkaline solution containing a potassium hydroxide, a sodium hydroxide, an ammonium, etc. The rinsing liquid may be pure water, and the organic solvent may be a mixture of isopropyl alcohol vapor and an inert gas or isopropyl alcohol.

Figure 3:
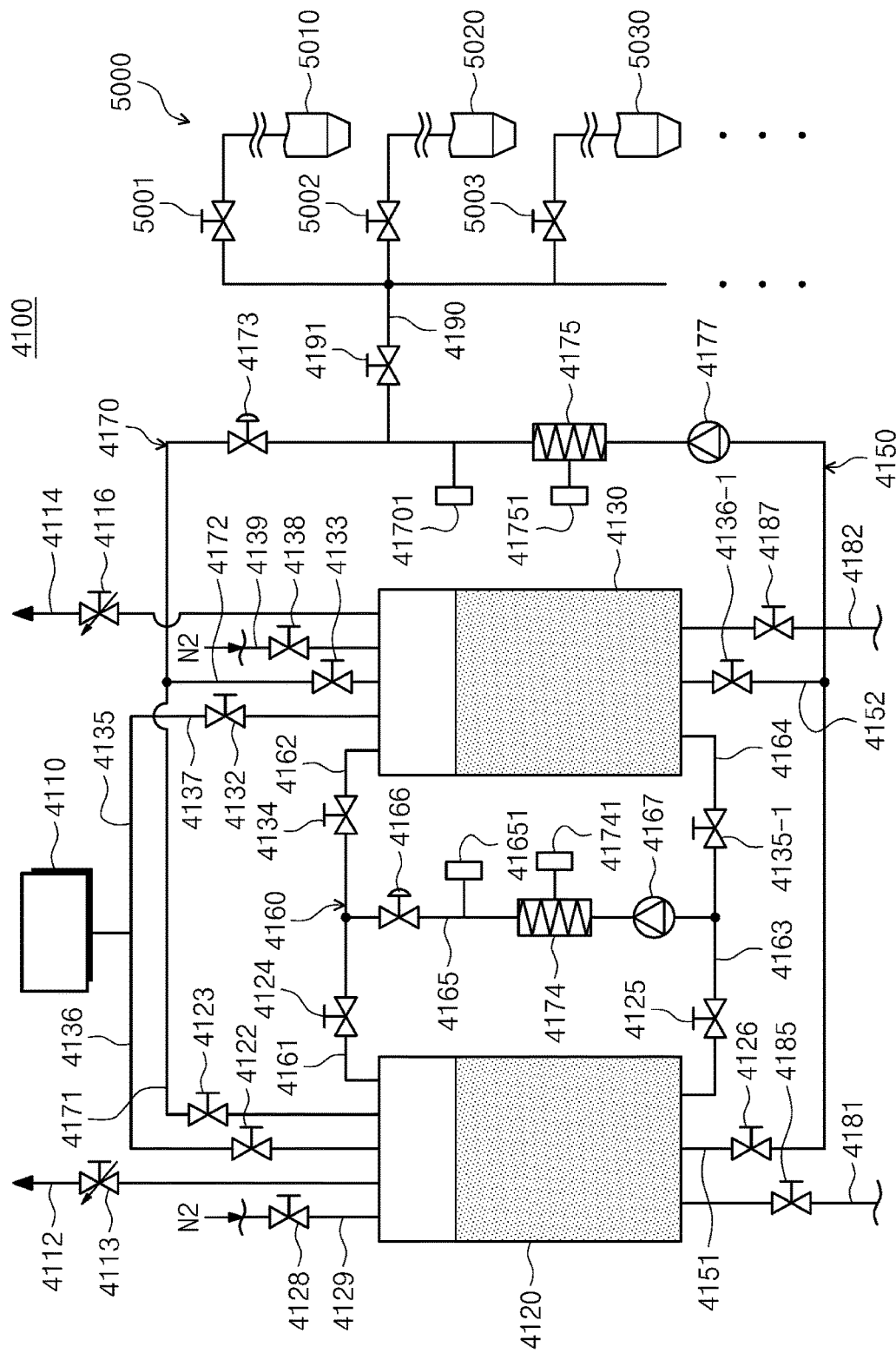
FIG. 3 is a diagram illustrating a liquid supply unit of the inventive concept.

The liquid supply unit 4100 supplies the liquid to the nozzle unit 380. FIG. 3 is a diagram illustrating a liquid supply unit 4100 of the inventive concept. Referring to FIG.

3, the liquid supply unit 4100 includes a liquid supply source 4110, a first tank 4120, a second tank 4130, inlet lines 4136 and 4137, a gas supply line 4129, 4139, an exhaust line 4112, 4114, an outlet line 4150, a drain line 4180, 4182, a circulation line 4160, and a supply line 4190.

The liquid supply source 4110 stores the liquid used in the process and supplies the liquid to the first tank 4120 or the second tank 4130. In an embodiment, the liquid may be isopropyl alcohol. Selectively, the liquid may be provided with a different type of chemical, organic solvent, or the like.

The first tank 4120 and the second tank 4130 have substantially the same structure. The first tank 4120 and the second tank 4130 store liquid. While the liquid is supplied to an object 5000 to be treated from one of the first tank 4120 or the second tank 4130, liquid exchange is performed in the other. In an embodiment, the object 5000 to be treated is a substrate treated in a plurality of process chambers. For example, any one of the objects 5000 to be treated is the substrate W shown in FIG. 2. In an embodiment, a sensor (not shown) is mounted within the first tank 4120 and the second tank 4130. The sensor (not shown) detects a remaining amount of liquid stored in an inner space of each tank.

The first tank 4120 and the second tank 4130 may store one liquid supplied from a single liquid supply source 4110. In some embodiments, a first liquid and a second liquid supplied from a separate liquid supply source 4110 may be mixed and stored in the first tank 4120 and the second tank 4130.

The inlet lines 4136 and 4137 may have a first inlet line 4136 and a second inlet line 4137, respectively. The first inlet line 4136 connects the liquid supply source 4110 to the first tank 4120. A first inlet valve 4122 is installed at the first inlet line 4136 to control whether the liquid is supplied from the liquid supply source 4110 to the first tank 4120 and a supply flow rate. The second inlet line 4137 connects the liquid supply source 4110 to the second tank 4130. A second inlet valve 4132 is installed at the second inlet line 4137 to control whether the liquid is supplied from the liquid supply source 4110 to the second tank 4130 and a supply flow rate.

The gas supply lines 4129 and 4139 supply the gas into respective tanks 4120 and 4130. In an embodiment, the gas supply lines 4129 and 4139 include a first gas supply line 4129 and a second gas supply line 4139. The first gas supply line 4129 supplies the gas into the first tank 4120, and the second gas supply line 4139 supplies gas into the second tank 4130. A first gas valve 4128 is installed at the first gas supply line 4129. The first gas valve 4128 controls whether the gas supplied to the first tank 4120 is supplied and the supply flow rate. A second gas valve 4138 is installed at the second gas supply line 4139. The second gas valve 4138 controls whether the gas supplied to the second tank 4130 is supplied and the supply flow rate. The gas prevents the liquid stored in each of the tanks 4120 and 4130 from shaking or volatilizing. In an embodiment, the gas is provided as an inert gas. For example, the gas is a nitrogen.

The exhaust lines 4112 and 4114 exhaust respective inner space of respective tanks 4120 and 4130. In an embodiment, the exhaust lines 4112 and 4114 include a first exhaust line 4112 and a second exhaust line 4114, respectively. The first exhaust line 4112 exhausts the inner space of the first tank 4120. The second exhaust line 4114 exhausts the inner space of the second tank 4130. A first exhaust valve 4113 is installed at the first exhaust line 4112. The first exhaust valve 4113 controls whether the inner space of the first tank 4120 is exhausted and the exhaust flow rate. A second exhaust valve 4116 is installed at the second exhaust line 4114. The second exhaust valve 4116 controls whether the inner space of the second tank 4130 is exhausted and the exhaust flow rate.

The outlet line 4150 connects the first tank 4120 and the second tank 4130 to the supply line 4190. In addition, the outlet line 4150 recollects a liquid discharged from each of the first tank 4120 and the second tank 4130 back to each of the first tank 4120 and the second tank 4130. Hereinafter, a portion of the outlet line 4150 which recollects a liquid discharged from each of the first tank 4120 and the second tank 4130 back to the first tank 4120 and the second tank 4130 will be referred to as a recollecting line 4170.

The supply line 4190 supplies the liquid to the object 5000 to be treated. The outlet line 4150 has a first outlet line 4151 and a second outlet line 4152. The first outlet line 4151 connects the first tank 4120 to the supply line 4190. A first outlet valve 4126 is installed at the first outlet line 4151 to control a flow rate of the liquid supplied from the first tank 4120 to the supply line 4190. The second outlet line 4152 connects the second tank 4130 to the supply line 4190. A second outlet valve 4136-1 is installed at the second outlet line 4152 to control whether the liquid supplied from the second tank 4230 to the supply line 4190 is supplied and a supply flow rate thereof.

The drain lines 4181 and 4182 include a first drain line 4181 and a second drain line 4182, respectively. The first drain line 4181 drains the first tank 4120. A first drain valve 4185 is installed at the first drain line 4181 to control whether the liquid discharged from the first tank 4120 is drained and a drain flow rate. The second drain line 4182 drains the second tank 4130. A second drain valve 4187 is installed at the second drain line 4182 to control whether the liquid discharged from the second tank 4130 is drained and a drain flow rate.

The recollecting line 4170 allows the liquid to be recollected to each of the tanks 4120 and 4130 without being supplied to the supply line 4190 when a pressure of the liquid in the outlet line 4150 is greater than or equal to a predetermined pressure. The recollecting line 4170 recollects the liquid from the supply line 4190 to the inner space of each of the first tank 4120 or the second tank 4130. The recollecting line 4170 has a first recollecting line 4171 and a second recollecting line 4172. The first recollecting line 4171 recollects the liquid to the first tank 4120. A first recollecting valve 4123 is installed at the first recollecting line 4171 to control whether the liquid recollected from the supply line 4190 to the first tank 4120 is recollected and the recollecting flow rate. The second recollecting line 4172 recollects the liquid to the second tank 4130. A second gas valve 4138 is installed at the second recollecting line 4172 to control whether the liquid recollected from the supply line 4190 to the second tank 4130 is recollected and the recollecting flow rate.

In an embodiment, the outlet line 4150 is provided with a second pump 4177, a second heater 4175, a second pressure sensor 41701, and a second pressure providing member 4173. In an embodiment, the second pump 4177, the second heater 4175, the second pressure sensor 41701, and the second pressure providing member 4173 are sequentially installed upstream to downstream with respect to each of the tanks 4120 and 4130. In an embodiment, the second pump 4177 controls the supply flow rate of the liquid by controlling a stroke per minute. The second heater 4175 heats a liquid flowing through the outlet line 4150. The second pressure sensor 41701 measures the pressure of the liquid in the outlet line 4150.

The second pressure providing member 4173 is provided at a downstream of the second heater 4175, and the pressure of the liquid is provided high enough to pass through the second pressure providing member 4173. For example, the second pressure providing member 4173 is a member that generates a resistance to the flow of the liquid in a pipe through which the liquid flows. In an embodiment, the second pressure providing member 4173 may be provided as any one of a back pressure regulator and a filter. Selectively, the second pressure providing member 4173 may be provided as a pipe having a diameter smaller than a diameter of the pipe forming the outlet line 4150. Accordingly, a high pressure is required to pass through the second pressure providing member 4173. Hereinafter, as an example, a reverse pressure regulator (a second regulator) 4173 will be described as the second pressure providing member 4173. The second pressure providing member 4173 may be provided as another member requiring a high pressure to pass through the second pressure providing member 4173.

The second regulator 4173 controls the pressure of the liquid in the outlet line 4150 based on the pressure measured by the second pressure sensor 41701. In an embodiment, the second regulator 4173 is provided as a back pressure regulator. For example, the second regulator 4173 can be operated in the same way as a valve that opens when a pressure at an upstream exceeds the predetermined pressure so that the liquid flows. Accordingly, the pressure at the upstream of the second regulator 4173 does not exceed the predetermined pressure. A second temperature sensor 41751 is installed at the second heater 4175. The second temperature sensor 41751 may measure a temperature of the second heater 4175. The second temperature sensor 41751 may measure a temperature of the contact surface where the second heater 4175 and the liquid in the circulation line contact (liquid contacts). In this case, the contact surface may be a surface of the second heater 4175. For example, the second temperature sensor 41751 may be installed at a surface of the second heater 4175. In an embodiment, the supply line 4190 is connected to a portion of the outlet line 4150 between the second pressure sensor 41701 and the second regulator 4173. Accordingly, the liquid may flow to the supply line 4190 without flowing to the recollecting line 4170 until the pressure of the liquid flowing through the outlet line 4150 reaches the predetermined pressure.

The circulation line 4160 circulates the liquid stored in the inner space of the first tank 4120 and the second tank 4130. The circulation line 4160 has a first line 4161, a second line 4162, a third line 4163, a fourth line 4164, and a shared line 4165.

The shared line 4165 connects the first line 4161, the second line 4162, the third line 4163, and the fourth line 4164 together. The liquid flowing through the shared line 4165 is introduced back into the first tank 4120 through the first line 4161 or into the second tank 4130 through the second line 4162. Likewise, the liquid stored in the inner space of the first tank 4120 circulates through the first line 4161, the shared line 4165, and the third line 4163. The liquid of the second tank 4130 circulates through the second line 4162, the shared line 4165, and the fourth line 4164.

In the shared line 4165, a first pump 4167, a first heater 4174, a first pressure sensor 41651, and a first pressure providing member 4166 are installed. In an embodiment, the first pump 4167, the first heater 4174, the first pressure sensor 41651, and the first pressure providing member 4166 are sequentially installed upstream to downstream with respect to each of the tanks 4120 and 4130.

In an embodiment, the first pump 4167 controls the stroke per minute to regulate the supply flow rate of the liquid. The first heater 4174 heats the liquid flowing through the circulation line 4160. The first pressure sensor 41651 measures the pressure of the liquid flowing through the shared line 4165.

The first pressure providing member 4166 is provided at a downstream of the first heater 4174, such that the pressure of the liquid to pass through the first pressure providing member 4166 is provided higher than the pressure of the liquid to pass through the first heater 4174. For example, the second pressure providing member 4173 is a member that generates a resistance to the flow of liquid in a pipe through which the liquid flows. In an embodiment, the first pressure providing member 4166 may be provided as any one of a back pressure regulator and a filter. In some embodiments, the first pressure providing member 4166 may be provided as a pipe having a diameter smaller than the diameter of the pipe forming the shared line 4165. Accordingly, in order to pass through the first pressure providing member 4166, the pressure of the liquid must be increased. Hereinafter, as an example, a reverse pressure regulator (a first regulator) 4166 will be described as the first pressure providing member 4166. The first pressure providing member 4166 may be provided as another member that requires a high pressure to pass through the first pressure providing member 4166. The first regulator 4166 controls the pressure of the liquid in the shared line 4165 based on the pressure measured by the first pressure sensor 41651. For example, the first regulator 4166 may be operated in the same manner as a valve that opens when the pressure at the upstream exceeds the predetermined pressure so that the liquid flows. Accordingly, the pressure at the upstream of the first regulator 4166 does not exceed the predetermined pressure. A first temperature sensor 41741 is installed at the first heater 4174. The first temperature sensor 41741 may measure a temperature of the first heater 4174. The first temperature sensor 41741 may measure the temperature of the contact surface where the first heater 4174 and the liquid in the circulation line 4160 contact each other. In this case, the contact surface may be a surface of the first heater 4174. For example, the first temperature sensor 41741 may be installed on the surface of the first heater 4174.

The first line 4161 is connected to a top surface of the first tank 4120. The liquid passing through the first pump 4167 and the first heater 4174 is introduced into the first tank 4120 through the first line 4161. A first valve 4124 is installed at the first line 4161 to control whether a liquid flowing into the first tank 4120 from the shared line 4165 is introduced and an inflow flow rate thereof. The second line 4162 is connected to a top surface of the second tank 4130. The liquid passing through the first pump 4167, the first heater 4174 and the first pressure providing member 4166 flows into the second tank 4130 through the second line 4162. A second valve 4134 is installed at the second line 4162 to control whether the liquid flowing into the second tank 4130 from the shared line 4165 is introduced and the inflow flow rate thereof. The third line 4163 is connected to a bottom surface of the first tank 4120. The liquid of the first tank 4120 is discharged through the third line 4163. A third valve 4125 is installed at the third line 4163 to control whether the liquid supplied from the first tank 4120 to the first heater 4174 is supplied and a supply flow rate. The fourth line 4164 is connected to a bottom surface of the second tank 4130. The liquid stored in the inner space of the second tank 4130 is discharged through the fourth line 4164. A fourth valve 4135-1 is installed at the fourth line 4164 to control whether the liquid supplied from the second tank 4130 to the first heater 4174 is supplied and a supply flow rate thereof.

Figure 4:
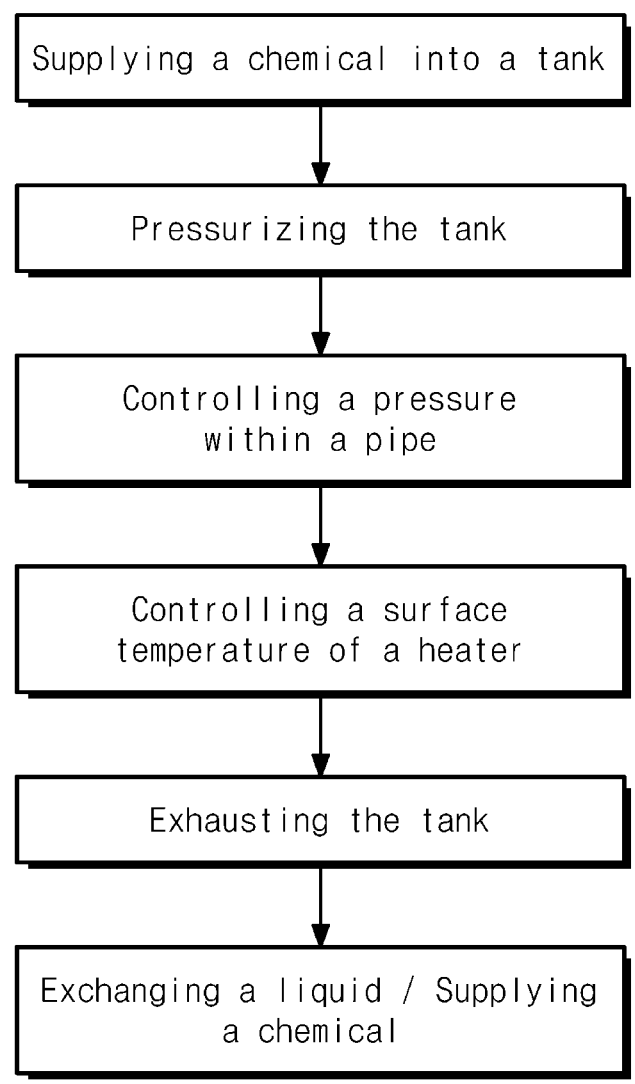
FIG. 4 is a flowchart illustrating a liquid supply method according to an embodiment of the inventive concept.
Figure 6:
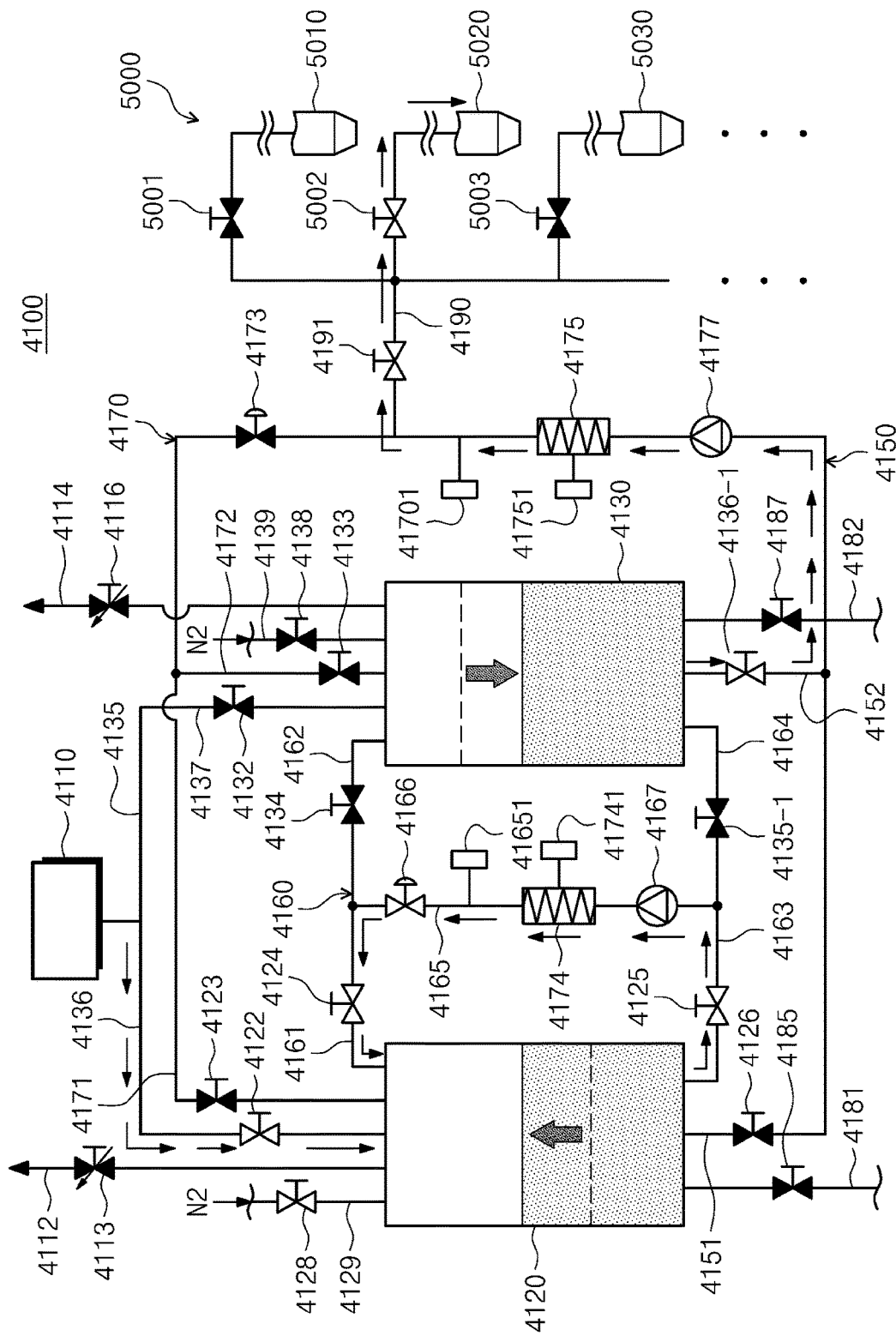
Figure 7:
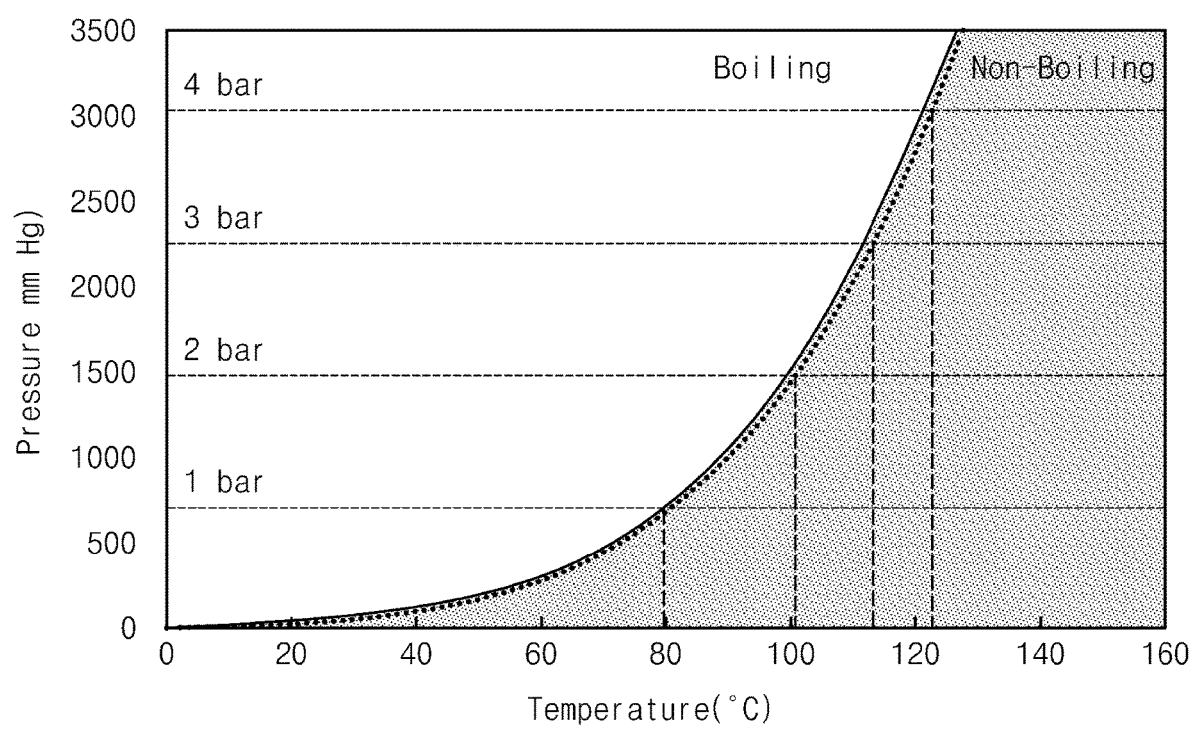

Hereinafter, a liquid supply method of the inventive concept will be described with reference to FIG. 4 to FIG. 12. The controller controls the liquid supply unit 4100 to perform the liquid supply method of the inventive concept. FIG. 4 is a flowchart illustrating a liquid supply method according to an embodiment of the inventive concept. FIG. 5 to FIG. 6 and FIG. 8 to FIG. 9 are sequentially showing a liquid supply method according to an embodiment of the inventive concept, and FIG. 7 is a graph showing a boiling point according to pressure of the isopropyl alcohol.

Referring to FIG. 4, first, the liquid is supplied to the inner space of the first tank 4120 or the second tank 4130. In an embodiment, while supplying the liquid stored in the inner space of the second tank 4130 to the nozzle unit 380, the liquid stored in the inner space of the first tank 4120 is circulated through the circulation line 4160, replenishing the liquid to the inner space of the first tank 4120. Similarly, while the liquid stored in the inner space of the first tank 4120 is supplied to the nozzle unit 380, the liquid stored in the inner space of the second tank 4130 may be circulated through the circulation line 4160, replenishing the liquid to the inner space of the second tank 4130. Hereinafter, as an example, it will be described as replenishing the liquid into the inner space of the first tank 4120.

Figure 5:
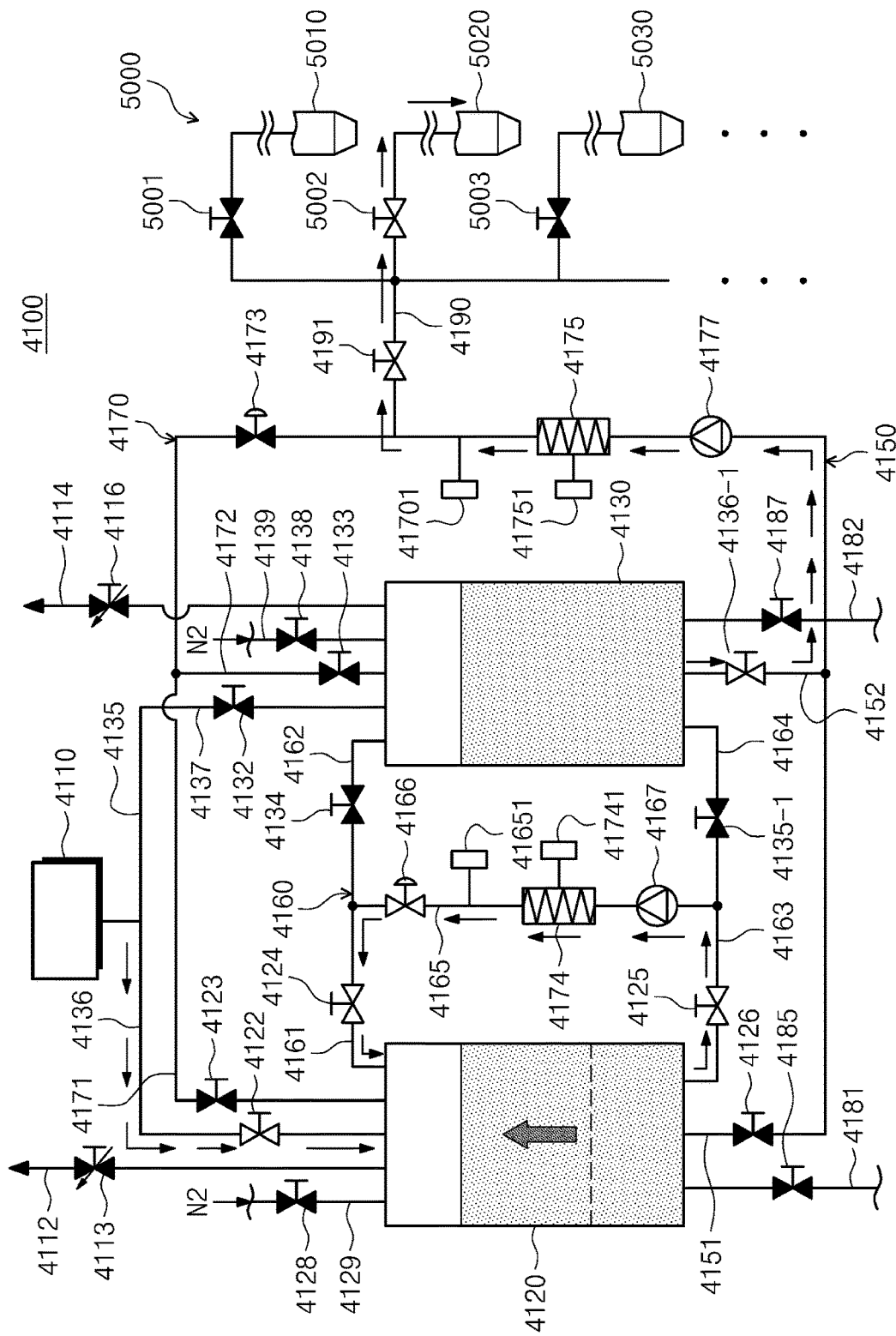
FIG. 5 to FIG. 9 are views sequentially illustrating the liquid supply method using the liquid supply unit according to an embodiment of the inventive concept.

As illustrated in FIG. 5, the liquid is supplied from the liquid supply source 4110 to the inner space of the first tank 4120 through the first inlet line 4136. When the liquid supply starts, a nitrogen is supplied to the inner space of the first tank 4120 through the first gas supply line 4129, as illustrated in FIG. 6. In an embodiment, while the nitrogen is supplied to the inner space of the first tank 4120, the inner space is pressurized. For example, a pressure of the gas supplied to the inner space of the first tank 4120 may be provided higher than the exhaust pressure exhausted through the first exhaust line 4112. In an embodiment, the first exhaust valve 4113 may be closed while supplying the gas to the inner space. Referring to FIG. 7, it may be seen that the boiling point increases as the pressure of isopropyl alcohol increases. In the inventive concept, by pressurizing the inner space, the boiling point of the liquid in the liquid supply unit increases. Accordingly, there is an advantage of preventing the liquid from boiling at a relatively low temperature.

Figure 8:
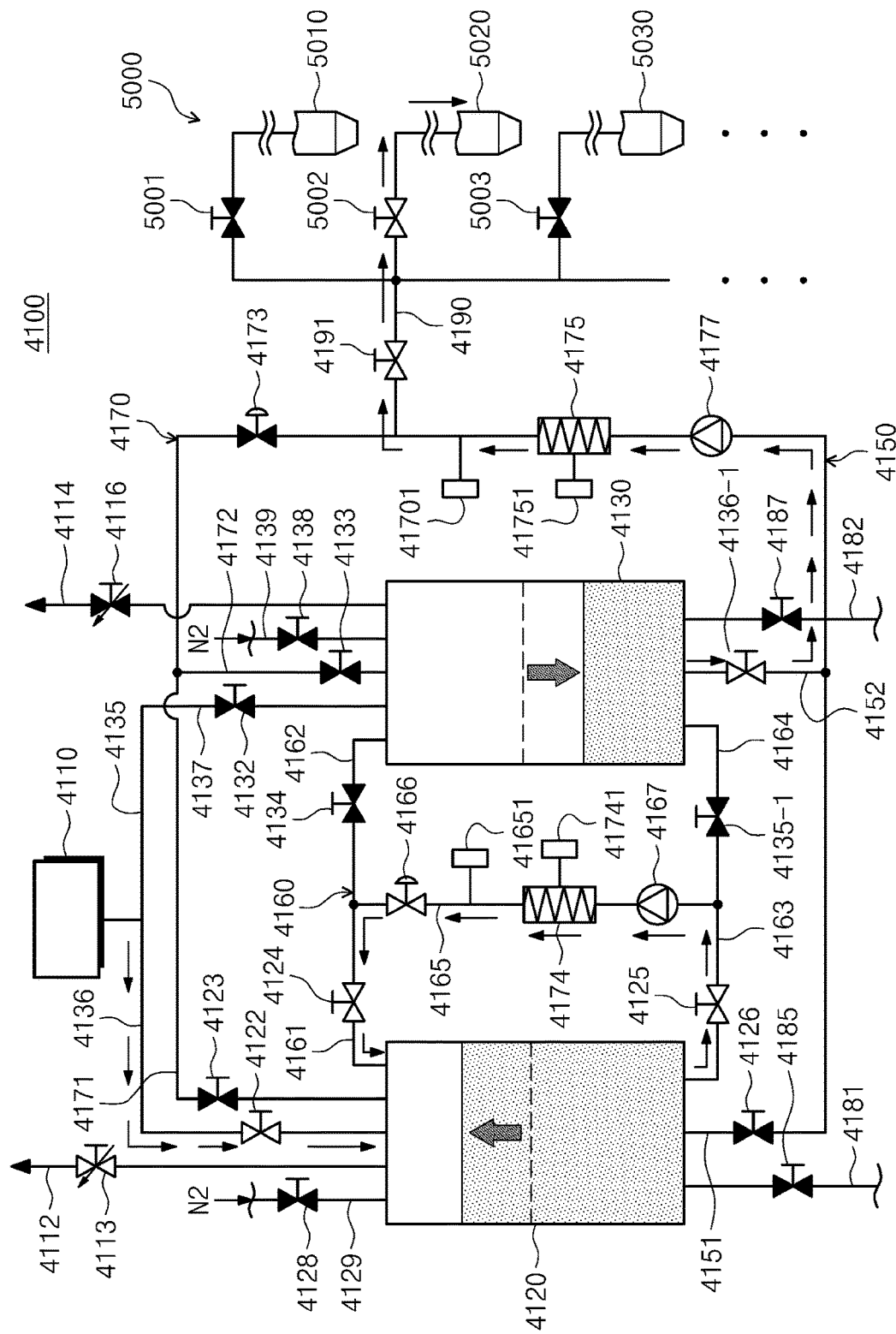

While replenishing the liquid to the inner space of the first tank 4120, the liquid stored in the first tank 4120 circulates through the circulation line 4160 as shown in FIG. 8. While the liquid is circulating, the first pressure sensor 41651 continuously measures the pressure of the liquid flowing through the shared line 4165. The first regulator 4166 adjusts the pressure in the circulation line 4160 based on this. For example, the inner space is continuously pressurized by the gas introduced through the gas supply line until the pressure measured by the first pressure sensor 41651 reaches the predetermined pressure. When the pressure of the liquid measured by the first pressure sensor 41651 reaches the predetermined pressure, the liquid flows through the first regulator 4166. Accordingly, in order to continuously circulate the liquid in the circulation line 4160, the pressure in the circulation line 4160 must reach a predetermined pressure, and to this end, the inner space of the tank is continuously pressurized. When the pressure in the circulation line 4160 reaches a predetermined pressure, the pressure at an upstream of the first regulator 4166 is maintained at a predetermined pressure. To this end, as shown in FIG. 8, the first exhaust valve 4113 is opened. By opening the first exhaust valve 4113, the pressure of the liquid flowing through the circulation line 4160 is maintained at a predetermined pressure.

While the liquid is replenished into the inner space of the first tank 4120, the temperature of the first heater 4174 is controlled. In an embodiment, the output of the first heater 4174 is controlled based on the temperature measured by the first temperature sensor 41741. The output of the first heater 4174 is adjusted so that isopropyl alcohol flowing through the circulation line 4160 does not boil. For example, the output of the first heater 4174 is adjusted to be less than or equal to the boiling point of isopropyl alcohol based on the pressure measured by the first pressure sensor 41651. In an embodiment, since the pressure in the circulation line 4160 is adjusted to the predetermined pressure, the output of the first heater 4174 is adjusted to be equal to or below the boiling point of isopropyl alcohol based on the predetermined pressure. In an embodiment, the first temperature sensor 41741 is provided to measure the temperature of a contact surface between the first heater 4174 and the liquid flowing through the shared line 4165, e.g., the surface of the first heater 4174 contacting the liquid flowing through the shared line 4165. In an embodiment, the first temperature sensor 41741 may measure the temperature of the surface of the first heater 4174. Accordingly, there is an advantage of preventing the liquid from boiling at a surface of the first heater 4174 contacting the liquid flowing through the first heater 4174. That is, the inventive concept has the advantage of preventing the liquid from boiling on the contact surface between the first heater 4174 and the liquid by adjusting the output of the first heater 4174 based on the temperature measured at the upstream or downstream of the first heater 4174.

Figure 9:
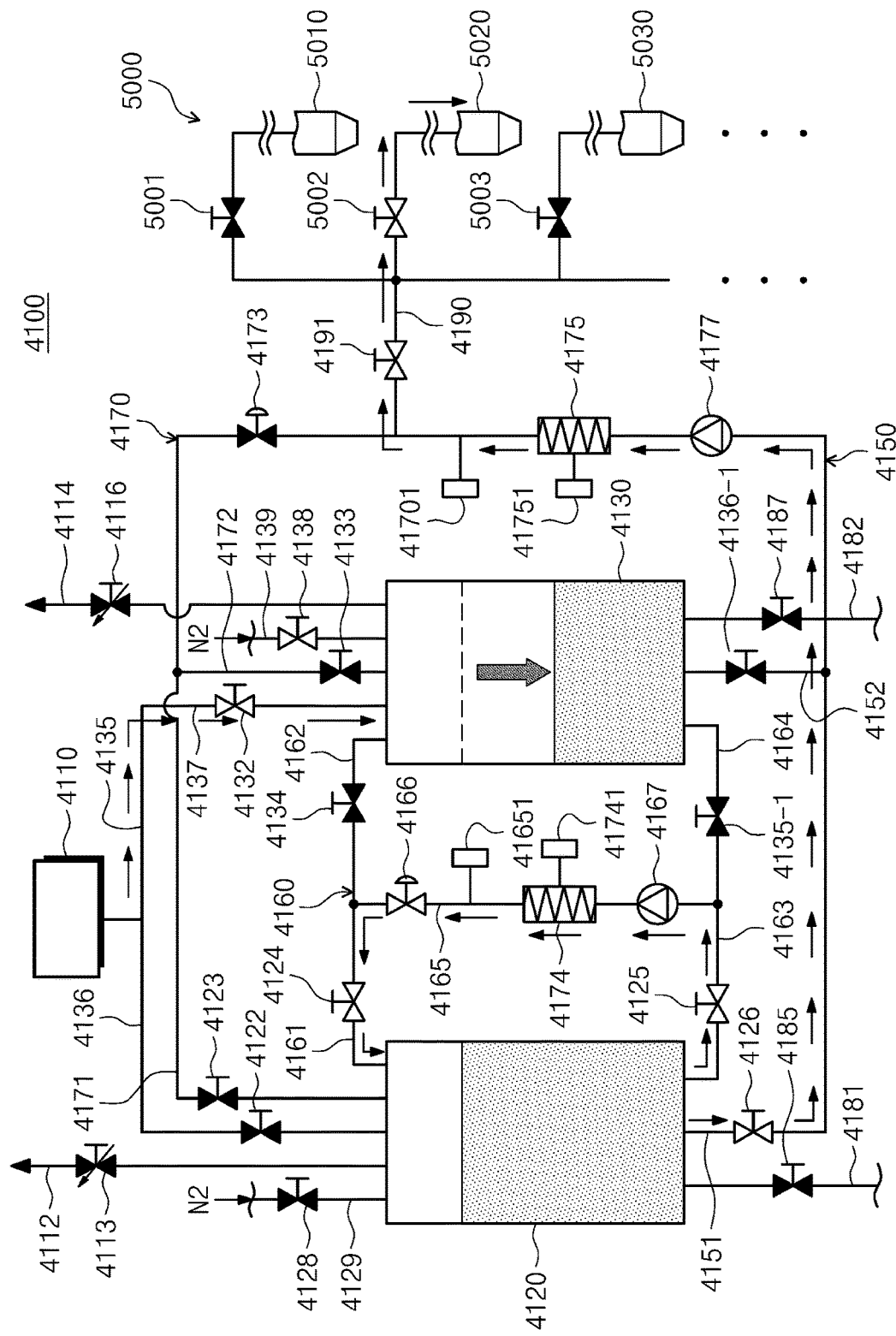

When the liquid replenishment inside the first tank 4120 is completed through the above-described process, the liquid is supplied to the nozzle unit 380 through the first tank 4120 as illustrated in FIG. 9. In this case, the liquid is replenished into the inner space of the second tank 4130, and the liquid stored at the inner space of the second tank 4130 is circulated through the circulation line 4160. The above-described liquid supply method is also applied when replenishing the liquid into the inner space of the second tank 4130.

Figure 10:
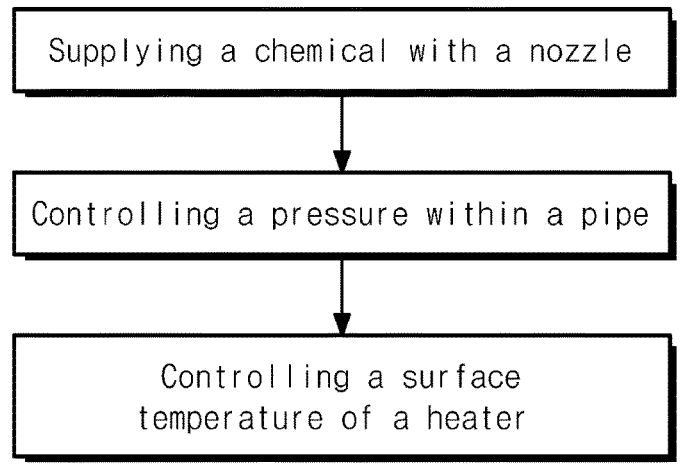
FIG. 10 is a flowchart illustrating the liquid supply method according to another embodiment of the inventive concept.
Figure 11:
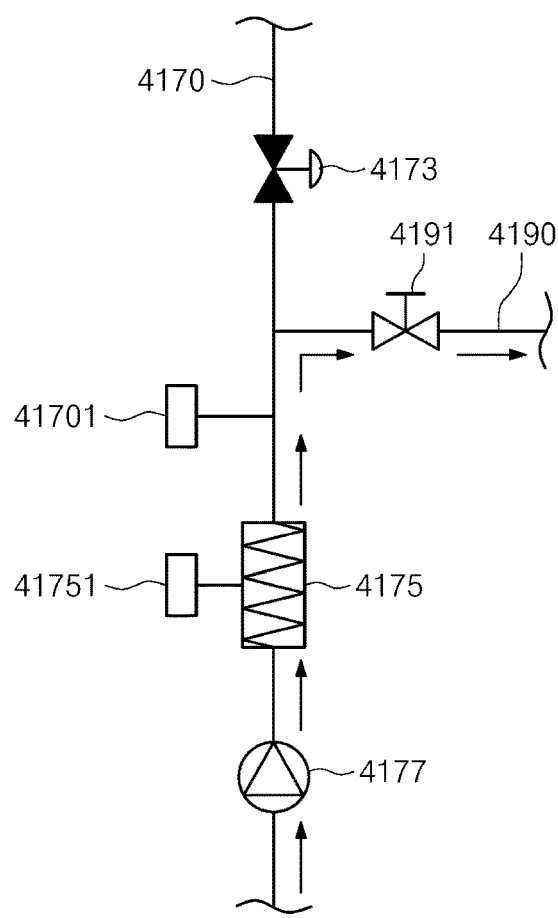
FIG. 11 to FIG. 12 are views sequentially illustrating the liquid supply method according to another embodiment of the inventive concept.
Figure 12:
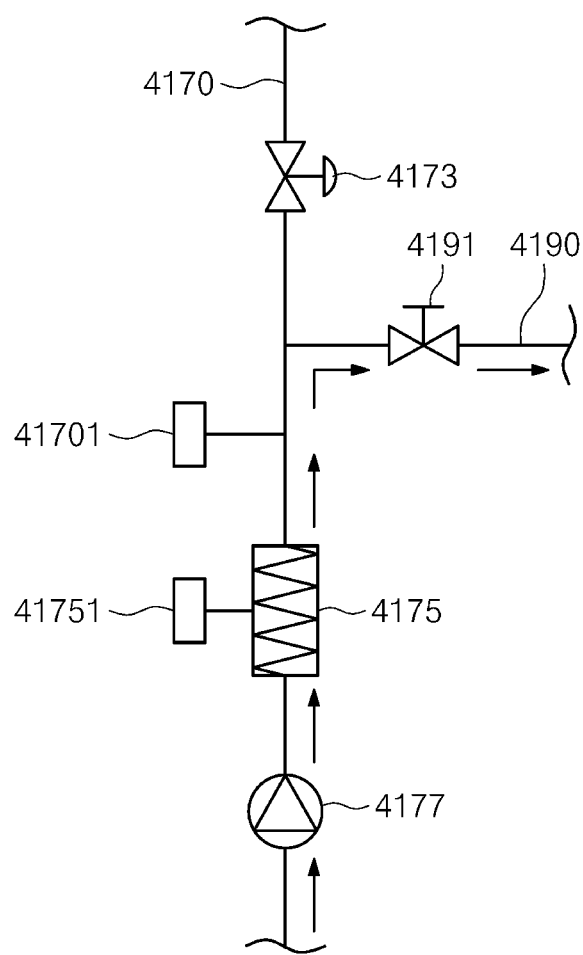

FIG. 10 is a flowchart illustrating a liquid supply method according to another embodiment of the inventive concept. Referring to FIG. 10, while supplying the liquid, the pressure in the pipe and the temperature of the surface where the heater and the liquid contact each other may be adjusted. In an embodiment, the surface where the heater and the liquid contact each other may be the surface of the heater. The method of adjusting the pressure in the pipe and the method of controlling the temperature of the surface of the heater are the same as described above. In an embodiment, while the liquid is supplied to the nozzle unit 380 through the outlet line 4150, the pressure in the outlet line 4150 is continuously measured by the second pressure sensor 41701 as illustrated in FIG. 11. As illustrated in FIG. 12, when the pressure of the liquid measured by the second pressure sensor 41701 reaches a predetermined pressure, the liquid flows through the second regulator 4173. Accordingly, in order for the liquid to be supplied to the recollecting line, the pressure of the outlet line 4150 must reach the predetermined pressure, and for this purpose, the inner space is continuously pressurized. While the liquid is supplied to the nozzle unit 380 through the outlet line 4150, the temperature of the second heater 4175 is adjusted. In an embodiment, the output of the second heater 4175 is adjusted based on the temperature measured by the second temperature sensor 41751. The output of the second heater 4175 is adjusted so that the isopropyl alcohol flowing through the outlet line 4150 does not boil. For example, the output of the second heater 4175 is adjusted to be less than or equal to the boiling point of the isopropyl alcohol based on the pressure measured by the second pressure sensor 41701. In an embodiment, since the pressure at the outlet line 4150 is adjusted to be the predetermined pressure, the output of the second heater 4175 is adjusted to be below the boiling point of the isopropyl alcohol based on the predetermined pressure. In an embodiment, the second temperature sensor 41751 is provided to measure a temperature of a contact surface between the second heater 4175 and the liquid flowing through the outlet line 4150, e.g., the surface of the second heater 4175 contacting the liquid flowing through the outlet line 4150. In an embodiment, the second temperature sensor 41751 may measure the temperature of the surface of the second heater 4175. Accordingly, there is an advantage in that the liquid flowing through the second heater 4175 and the outlet line 4150 is prevented from boiling at a contact surface.

The effects of the inventive concept are not limited to the above-mentioned effects, and the unmentioned effects can be clearly understood by those skilled in the art to which the inventive concept pertains from the specification and the accompanying drawings.

Although the embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A liquid supply unit for supplying a liquid comprising:
    a tank having an inner space for storing the liquid;
    an inlet line for supplying the liquid from a liquid supply source to the inner space and having an inlet valve installed thereon;
    an outlet line for supplying the liquid from the tank to a nozzle or for recollecting the liquid to the tank and having an outlet valve installed thereon;
    a gas supply line for supplying a gas to the inner space and having a gas control valve installed thereon;
    an exhaust line for exhausting the inner space and having an exhaust valve installed thereon;
    a circulation line for circulating the liquid stored in the inner space; and
    a controller configured to control the liquid supply unit so that the circulation line is pressurized while the liquid is supplied to the inner space.

2. The liquid supply unit of claim 1, wherein the controller is further configured to control the gas control valve and the exhaust valve so that the inner space is pressurized while the liquid is supplied to the inner space.

3. The liquid supply unit of claim 2, wherein the controller is configured to control the gas control valve and the exhaust valve so that the gas is supplied to the inner space but the exhaust valve is closed, while the liquid is supplied to the inner space.

4. The liquid supply unit of claim 1, wherein the circulation line comprises:
    a first pump;
    a first heater for heating the liquid within the circulation line; and
    a pressure providing member provided at a downstream of the first heater,
    wherein a pressure of the liquid required to pass through the pressure providing member is provided higher than a pressure of the liquid required to pass through the first heater.

5. The liquid supply unit of claim 4, wherein the pressure providing member is provided as a first regulator, the circulation line further comprises a first pressure sensor installed at an upper stream of the first regulator and sensing a pressure of the liquid within the circulation line, and the first regulator opens to allow a flow of the liquid when the pressure of the liquid within the circulation line becomes equal to or higher than a predetermined pressure.

6. The liquid supply unit of claim 5, wherein the first heater is provided with a first temperature sensor for measuring a temperature at a contact surface with the liquid, and the first heater is controlled so that the temperature at the contact surface with the liquid measured by the first temperature sensor does not exceed a boiling point of the liquid according to the predetermined pressure.

7. The liquid supply unit of claim 5, wherein the controller controls the exhaust valve to exhaust the inner space when the pressure of the liquid within the circulation line is equal to or higher than the predetermined pressure.

8. The liquid supply unit of claim 1, wherein the outlet line comprises:
    a pump;
    a heater for heating a liquid within the outlet line;
    a regulator configured to be opened to allow a flow of the liquid when a pressure at an upstream of the outlet line is equal to or higher than a predetermined pressure; and
    a pressure sensor installed at an upstream of the regulator for measuring the pressure of the liquid within the outlet line.

9. The liquid supply unit of claim 8 further comprising a supply line branching from the outlet line between the heater and the regulator and connected to the nozzle.

10. The liquid supply unit of claim 8, wherein the heater is provided with a temperature sensor for measuring a temperature at a contact surface with the liquid, and
    the controller controls the heater so that the temperature at the contact surface with the liquid measured by the temperature sensor does not exceed a boiling point of the liquid according to a predetermined pressure.

11. The liquid supply unit of claim 1, wherein the tank comprises a first tank and a second tank, the circulation line is connected to the first tank and the second tank, the controller is configured to control so that the liquid is supplied to the first tank through the inlet line and the liquid of an inner space of the first tank is circulated through the circulation line, while the liquid is supplied to the nozzle through the inlet line from the second tank.

* * * * *